(12) United States Patent
Romani et al.

(10) Patent No.: US 8,707,236 B2
(45) Date of Patent: Apr. 22, 2014

(54) SEMICONDUCTOR DEVICE WITH INTEGRATED DELAY CHAIN

(75) Inventors: Carlo Alberto Romani, Cornaredo (IT); Corrado Giorgio Castiglione, Aosta (IT); Massimo Scipioni, Portland, OR (US); Elvio Romanucci, Crispano (IT); Donato Tancredi, Torre del Greco (IT)

(73) Assignees: STMicroelectronics, Inc., Coppell, TX (US); STMicroelectronics S.r.l., Agrate Brianza (IT)

( * ) Notice: Subject to any disclaimer, the term of this patent is extended or adjusted under 35 U.S.C. 154(b) by 791 days.

(21) Appl. No.: 12/347,410

(22) Filed: Dec. 31, 2008

(65) Prior Publication Data

US 2010/0164585 A1 Jul. 1, 2010

(51) Int. Cl.
*G06F 17/50* (2006.01)
(52) U.S. Cl.
USPC .......................................... 716/118; 716/120
(58) Field of Classification Search
USPC ................................................ 716/118–122
See application file for complete search history.

(56) References Cited

U.S. PATENT DOCUMENTS

| 6,795,952 | B1* | 9/2004 | Stine et al. ...................... 716/56 |
| 7,420,229 | B2* | 9/2008 | Schultz et al. ................ 257/203 |
| 7,428,720 | B2* | 9/2008 | Kanno et al. .................. 716/127 |
| 7,987,442 | B2* | 7/2011 | Rajski et al. .................. 716/136 |
| 2007/0015297 | A1* | 1/2007 | Schultz et al. .................. 438/18 |
| 2008/0028345 | A1* | 1/2008 | Suri et al. .......................... 716/2 |

* cited by examiner

*Primary Examiner* — Binh Tat
(74) *Attorney, Agent, or Firm* — Seed IP Law Group PLLC

(57) ABSTRACT

A semiconductor device wherein a delay chain is integrated; the semiconductor device having a semiconductor layer. The delay chain includes a plurality of delay cells placed in the semiconductor layer and electrically connected to each other so as to form the delay chain. The semiconductor device includes a first and second metal lines respectively connected to a supply voltage and a reference voltage and placed in a longitudinal direction on a surface of the semiconductor layer; each delay cell of the plurality of cells is electrically connected with the first and second metal lines. Any delay cell and its successive or preceding delay cells of the delay chain are placed in a transversal direction with respect to the first or the second metal line.

30 Claims, 7 Drawing Sheets

SEMICONDUCTOR DEVICE WITH INTEGRATED DELAY CHAIN

BACKGROUND

1. Technical Field

The present disclosure refers to a semiconductor device wherein a delay chain is integrated.

2. Description of the Related Art

A clock domain with a different phase with respect to the main clock of a device is often necessary to memory controller circuit applications. For example, the controller of DDR memories needs a strobe signal (DQS) with a delay of a ¼ of the period of the main clock to read/write the data to come from the memory or to send to the memory.

The problem of generating a clock with a desired phase with respect to the main clock can be solved by a delay chain. A usual circuit includes a multiplexer adapted to select a desired delay among the available delays. A controller can be used to select the corrected delay.

Such a circuit, however, has substantial implementation problems; in fact, it is very difficult to assure the monotonicity of the delays along all the chain in the presence of hundreds of delay elements. The routing can have a substantial impact on the shortest delay element and the monotonicity of the successive delays along all the chain can be broken.

BRIEF SUMMARY

In view of the state of the art, the present disclosure provides a delay chain that assures the monotonicity for all the delays.

According to the present disclosure, this is achieved by means of a semiconductor device wherein a delay chain is integrated, the semiconductor device including a semiconductor layer, the delay chain including a plurality of delay cells placed in the semiconductor layer and electrically connected to each other so as to form the delay chain. The semiconductor device also includes a first and second metal lines respectively connected to a supply voltage and a reference voltage and placed in a longitudinal direction on a surface of the semiconductor layer, each delay cell of the plurality of cells electrically connected with the first and second metal lines, wherein any delay cell and its successive or preceding delay cells of the delay chain are placed in a transversal direction with respect to the first or the second metal line.

In accordance with another embodiment of the present disclosure, an integrated circuit is provided that includes a plurality of delay circuit cells formed in a chain in a semiconductor layer and coupled to first and second metal lines formed in a longitudinal direction on a surface of the semiconductor layer, each delay circuit cell having a directional axis oriented in a direction transverse to the longitudinal direction of the first and second metal lines; and a first metal path having an input coupled to a first delay circuit cell in the chain, and an output coupled to the last delay circuit cell in the chain, and a second metal path having an input coupled to the last delay circuit cell in the chain and an output coupled to the first delay circuit cell in the chain.

In accordance with another aspect of the foregoing embodiment any delay circuit cell and its successive or preceding delay circuit cells of the chain are faced toward each other so that any delay circuit cell is faced to a portion of the preceding delay circuit cell of the chain and a portion of the successive delay circuit cell of the chain.

In accordance with another aspect of the foregoing embodiment each delay circuit cell includes a first inverting circuit having an input terminal and an output terminal connected with the first metal path and a second inverting circuit having input and output terminals connected with the second metal path, each delay circuit cell configured to be not inverting.

In accordance with another aspect of the foregoing embodiment each delay circuit cell of the chain includes a programmable cell adapted to receive a dedicated control signal, the dedicated control signal controlling a switching of the dedicated control signal from the first metal path to the second metal path so that a delayed input signal is at an output terminal of the first delay circuit cell when the control signal of one delay circuit cell of the chain assumes a predetermined value.

In accordance with another aspect of the foregoing embodiment, the delay circuit cells are arranged in an interconnected chain in rows with adjacent delay circuit cells in the chain positioned in a staggered relationship in opposing rows so that each delay circuit cell faces a preceding delay circuit cell and a succeeding delay circuit cell in the chain.

BRIEF DESCRIPTION OF THE SEVERAL VIEWS OF THE DRAWINGS

The features and advantages of the present disclosure will become clear from the following detailed description of the embodiments thereof illustrated by way of non-limiting example in the attached drawings, in which.

DETAILED DESCRIPTION

Figure 1:
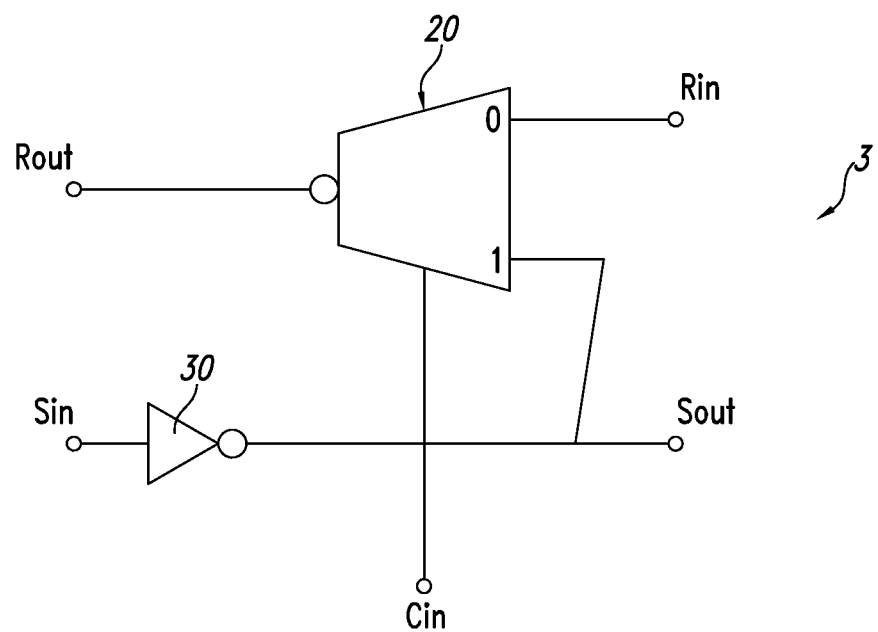
FIG. 1 shows a scheme of a base cell of a delay chain according to a prior design.

A base cell or delay unit 3 of a delay chain according to a prior design is shown in FIG. 1. The base cell 3 has two input terminals Sin and Rin with two respective output terminals Sout and Rout. Normally the signal at the input Sin will output from the output terminal Sout and the signal at the input Rin will output from the output terminal Rout. The base cell 3 is a programmable cell and includes a further input terminal for a control signal Cin capable of changing the behavior of the delay unit 3 so that the signal at the input terminal Sin outputs from the output terminal Rout.

The particular implementation of the base cell 3 shown in FIG. 1 includes a gate NOT 30 having the input terminal Sin and the output terminal Sout and an inverting multiplexer 20 having the input terminals Sout and Rin and the output terminal Rout. The gates 20 and 30 are configured so that the signal at the input terminal Sin goes to the output terminal Sout, the signal at the input terminal Rin goes to the output terminal Rout when the signal Cin is zero, while the signal at the input terminal Sin goes to the output terminal Rout when the signal Cin is1; in the last case Rout is the delayed signal.

Figure 2:
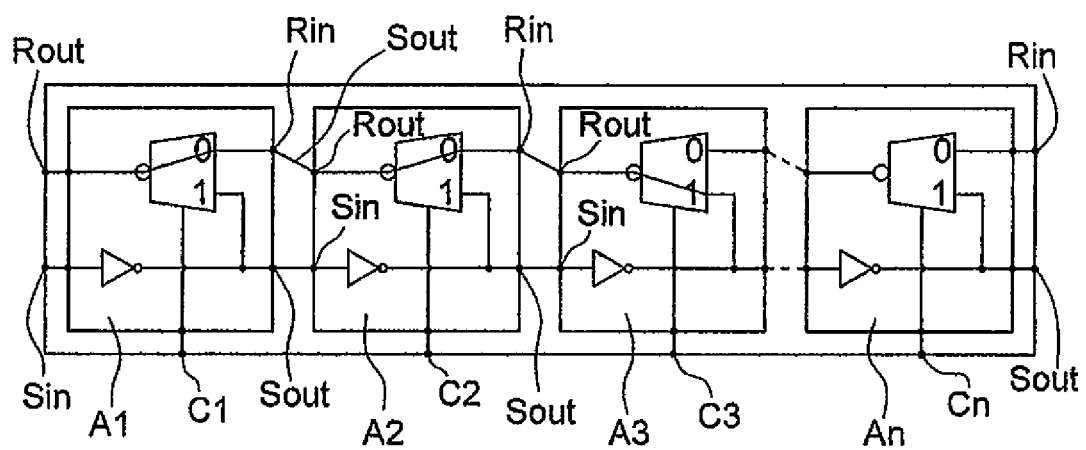
FIG. 2 is a scheme of a delay chain according to a prior design.

A delay chain includes a plurality of base cells A1, A2 ... An placed as shown in FIG. 2; the base cells A1, A2 ... An are placed in succession adjacent to each other so that the output terminal Sout of the base cell Ai-th (for i=1, ... n) is electrically connected with the input terminal Sin of the adjacent and successive base cell A(i+1)-th and the output terminal Rout of the of the base cell Ai-th is electrically connected with the input terminal Rin of the adjacent and preceding base cell A(i−1)-th. Each base cell of the plurality of base cells A1 ... An has a respective control signal C1, C2 ... Cn. The signals C1 ... Cn can assume the values 0 and 1; the first signal of the signal succession C1 ... Cn which assumes the value 1, allows the signal at the input terminal Sin to come back at the input terminal Rout with a certain delay. The delay increases if the control signal having value 1 is the control signal of one of the last cells of the succession A1, A2 ... An while the delay decreases if the control signal having value 1 is the control signal of one of the first cells of the succession A1, A2 ... An.

Moreover the structure is signal regenerative because each gate of the base cell sees exactly the same load and all the base cells have substantially the same delay.

Each one of the paths between the terminals Sin-Sout and Rin-Rout are inverting while the whole structure of the base cell 3 is not inverting; in this way the leading edge and the trailing edge of the clock signal passing through the delay cell are matched.

Figure 3:
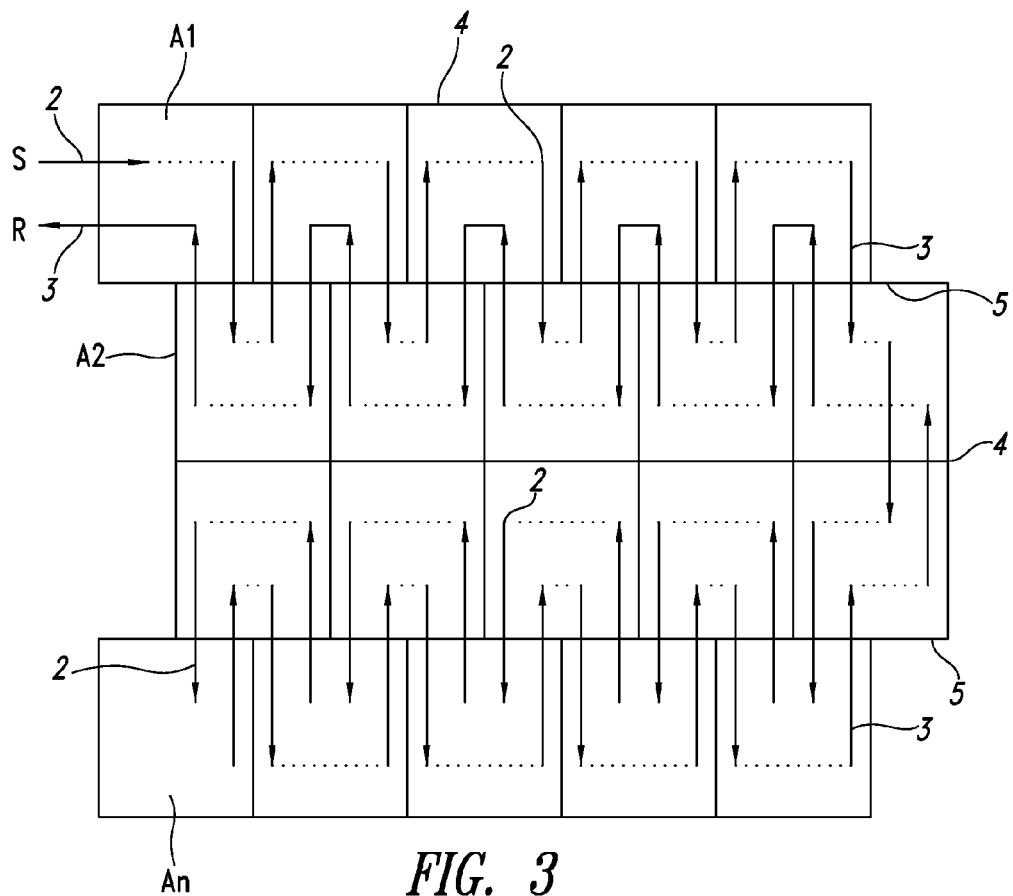
FIG. 3 is a schematic layout of a semiconductor device wherein a delay chain is integrated according to the present disclosure.
Figure 4:
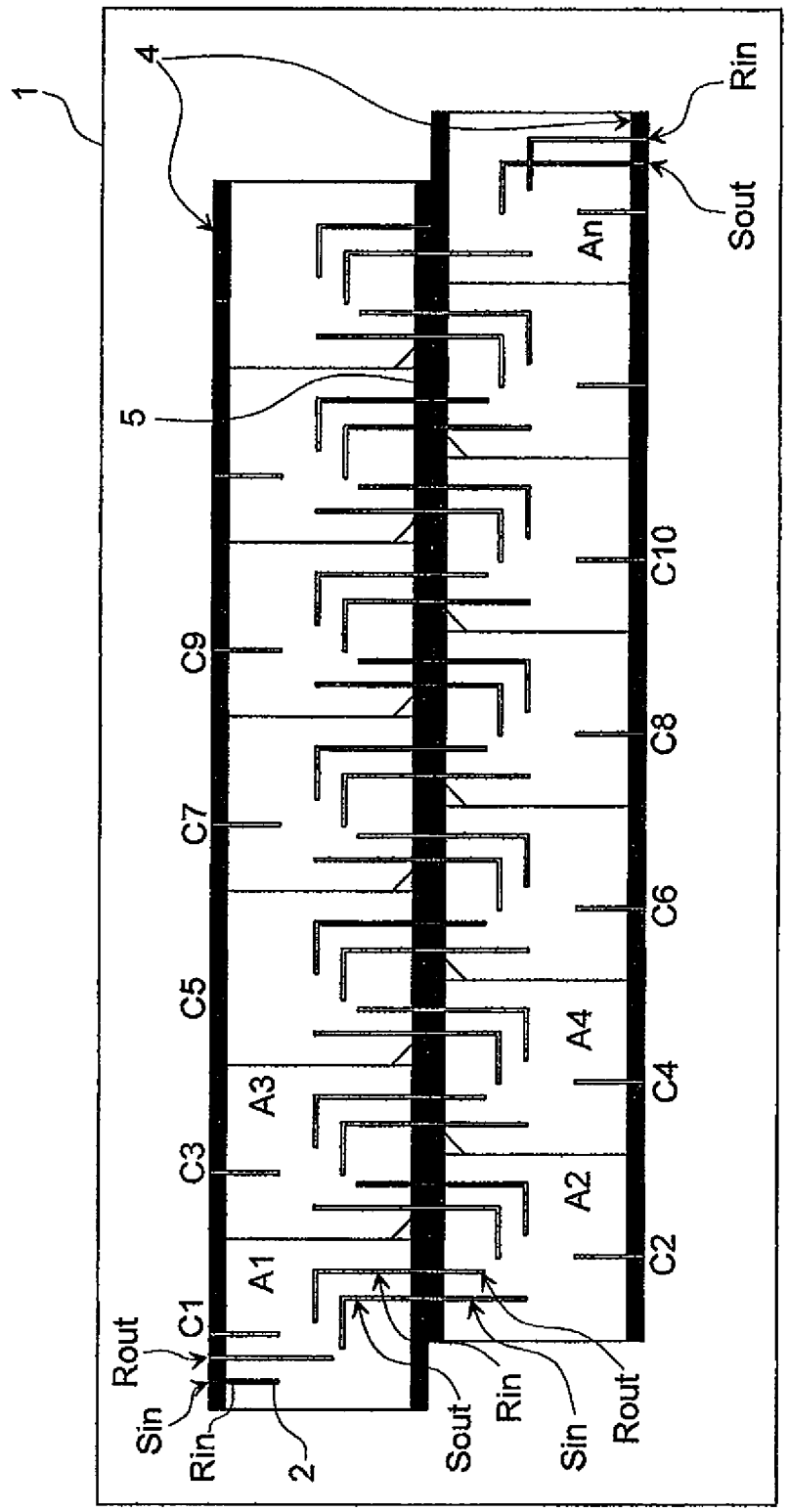
FIG. 4 is a more detailed schematic layout of the device in FIG. 3.

A schematic layout of the delay chain integrated in a semiconductor device according to the present disclosure is shown in FIGS. 3 and 4. The semiconductor device includes a semiconductor layer 1, a plurality of delay cells A1 ... An placed in the semiconductor layer and electrically connected to each other so as to form a chain; the arrows 2 and 3 in FIG. 3 indicate the paths of the signal S and of the signal R in the chain and the corresponding metal lines for the electrical paths in FIG. 4. The signal R is the signal S with a certain delay. A first metal line 4 and a second metal line 5 connected to a supply voltage Vdd and a reference voltage, preferably the ground GND, are placed in a longitudinal direction on a surface of the semiconductor layer 1. Each delay cell of the plurality of cells A1 and An is electrically connected with the first and second metal lines 4, 5. Any delay cell and its successive or preceding delay cells of the delay chain A1 ... An are placed so that a directional axis of the cell, preferably a longitudinal axis, is in a transversal direction with respect to the first or the second metal lines 4, 5. The signal S is at the input terminal Sin of the first cell A1 of the delay chain and outputs from the last cell An of the delay chain at the terminal Sout, as illustrated in FIG. 4. In the same way the signal R is at the input terminal Rin of the cell An of the delay chain and outputs from the cell A1 of the delay chain at the terminal Rout.

In addition, any delay cell and its successive or preceding delay cells of the delay chain are faced toward each other so that any delay cell is facing towards both a portion of the preceding delay cell of the delay chain and a portion of the successive delay cell of the delay chain. In other words, longitudinal axes of the cells are oriented along the same direction so as to be parallel, and the cells are staggered with respect to cells in an adjacent row. This is shown, for example, in FIG. 7, in which cell A2 in the bottom row faces both cell A1 and cell A3 in the top row.

The integrated delay chain according to the present disclosure has a structure more compact than that of the known integrated delay chains; therefore the structure of the delay chain occupies less space in the semiconductor device than the known integrated delay chains.

Figure 6:
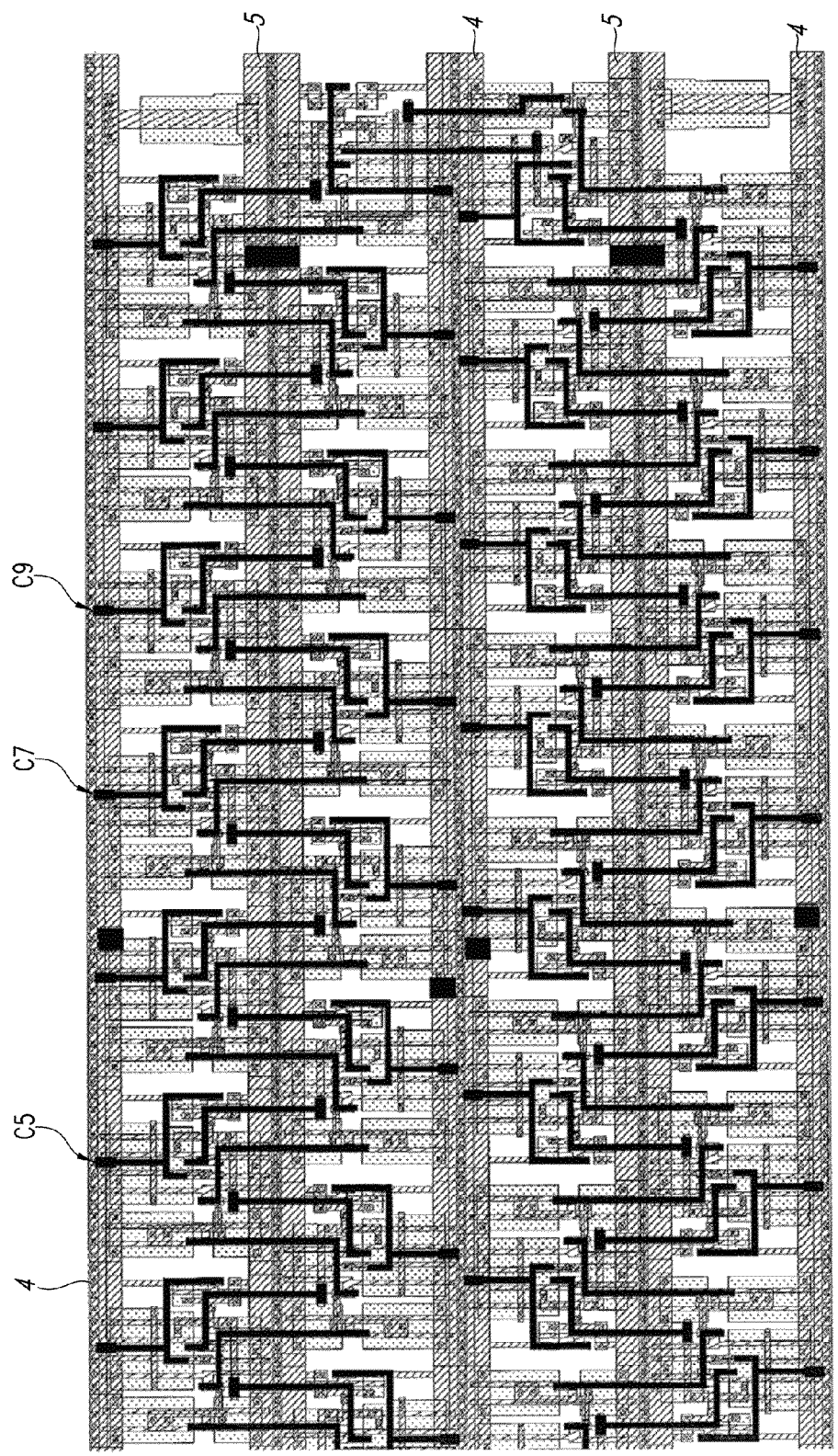
FIG. 6 is a detailed layout of a part of the device in FIG. 4.
Figure 8:
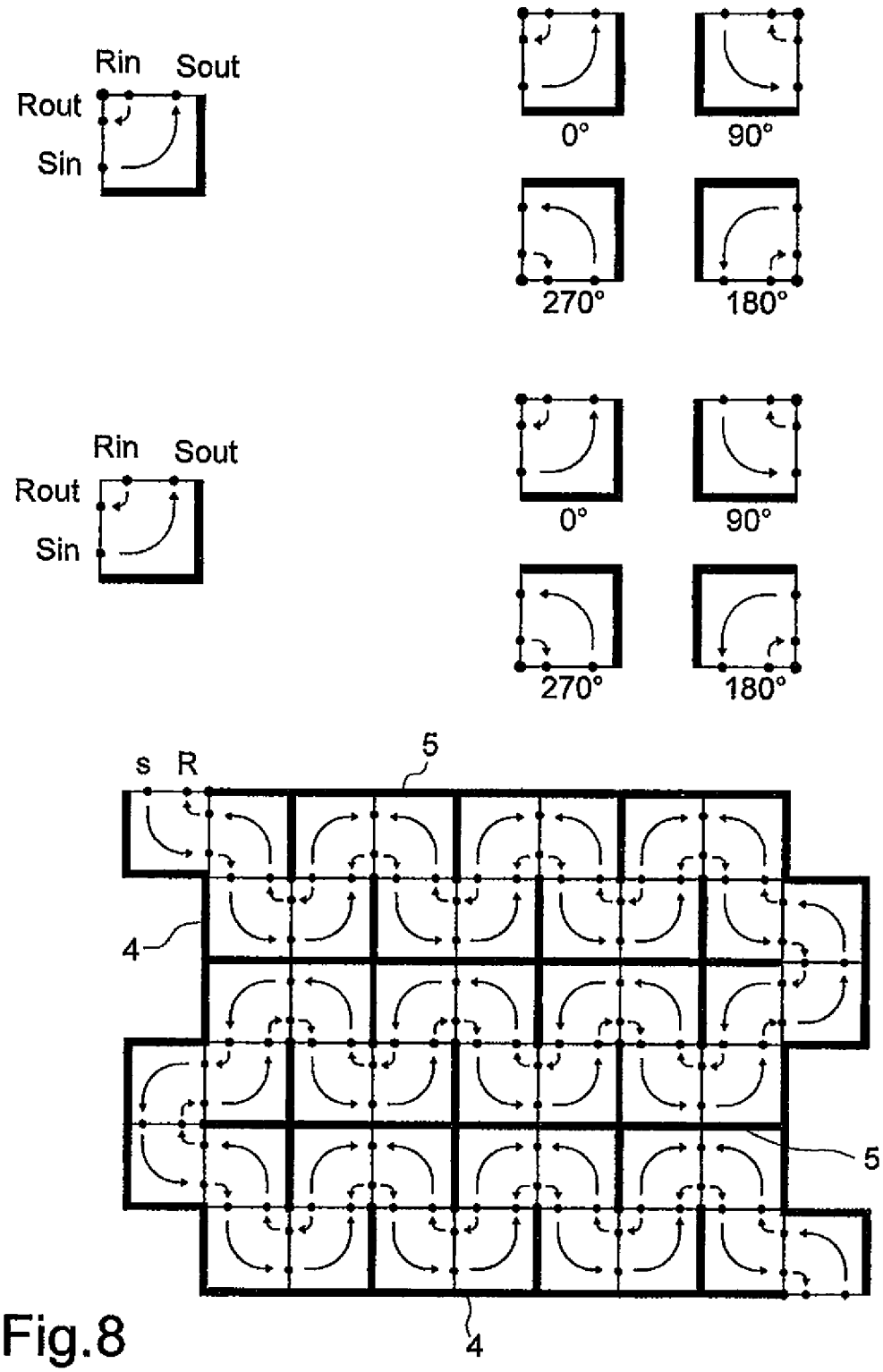
FIG. 8 is another schematic layout of a delay chain.

The delay chain can be composed of macro-blocks as shown in FIGS. 3, 6 and 8.

Figure 5:
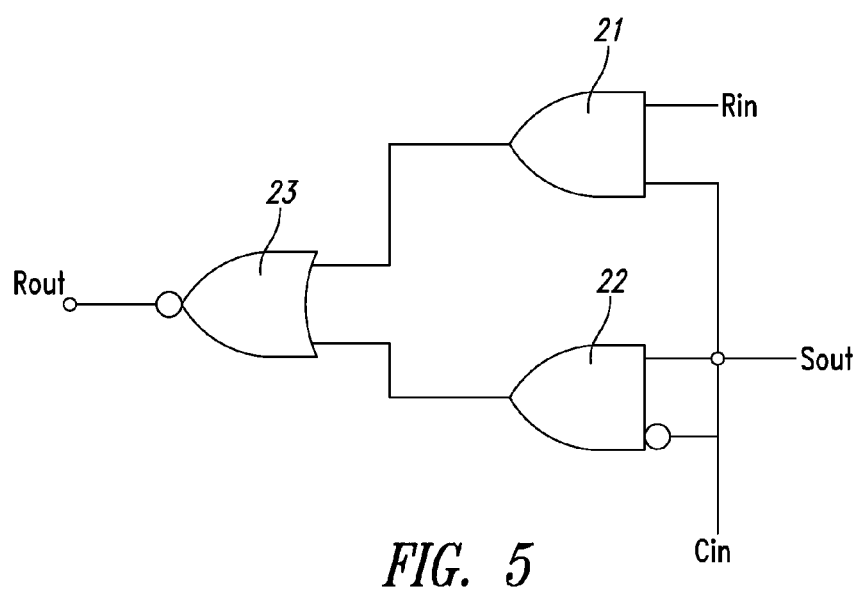
FIG. 5 is a circuit scheme of the implementation of the multiplexer in FIG. 1.

Each cell of the delay cell A1.An can be preferably a programmable cell; that is each cell A1.An can be provided with a control signal C1.Cn as shown in FIG. 4. This is the case wherein each delay cell is formed by the base cell 3 in FIG. 1. The multiplexer 20 of the base cell 3 is formed by means of first and second AND cells 21, 22 having respective input terminal Rin, Cin and Sout, Cin denied, as shown in FIG. 5. The outputs of the first and second AND cells 21, 22 are the input terminals of a NOR cell 23 having the output terminal Rout.

The signals C1 ... Cn can assume the values 0 and 1. The first signal of the signal succession C1 ... Cn which assumes the value 1 allows the signal at the input terminal Sin to come back at the input terminal Rout with a certain delay. This delay increases if the control signal having value 1 is the control signal of one of the last cells of the succession A1, A2 ... An while the delay decreases if the control signal having value 1 is the control signal of one of the first cells of the succession A1, A2 ... An.

Preferably the dimension of the electrical path for the respective signal S and the return signal R are equal for each delay cell of the delay chain A1 ... An. Also the electrical paths for the respective signals S and R between one cell and the preceding delay cell or the successive delay cell of the delay chain A1 ... An are equal, e.g., of equal length or equal resistance or impedance, for each of the cell couples of the delay chain.

Therefore the structure of the delay chain of the present disclosure obtains the same delay for each cell independently from the position of the single delay cell in the delay chain. All of the cells have substantially the same delay and therefore, in order to increase or decrease the delay time period of a signal in input to the delay, a delay cell can be added or deleted, respectively.

Figure 7:
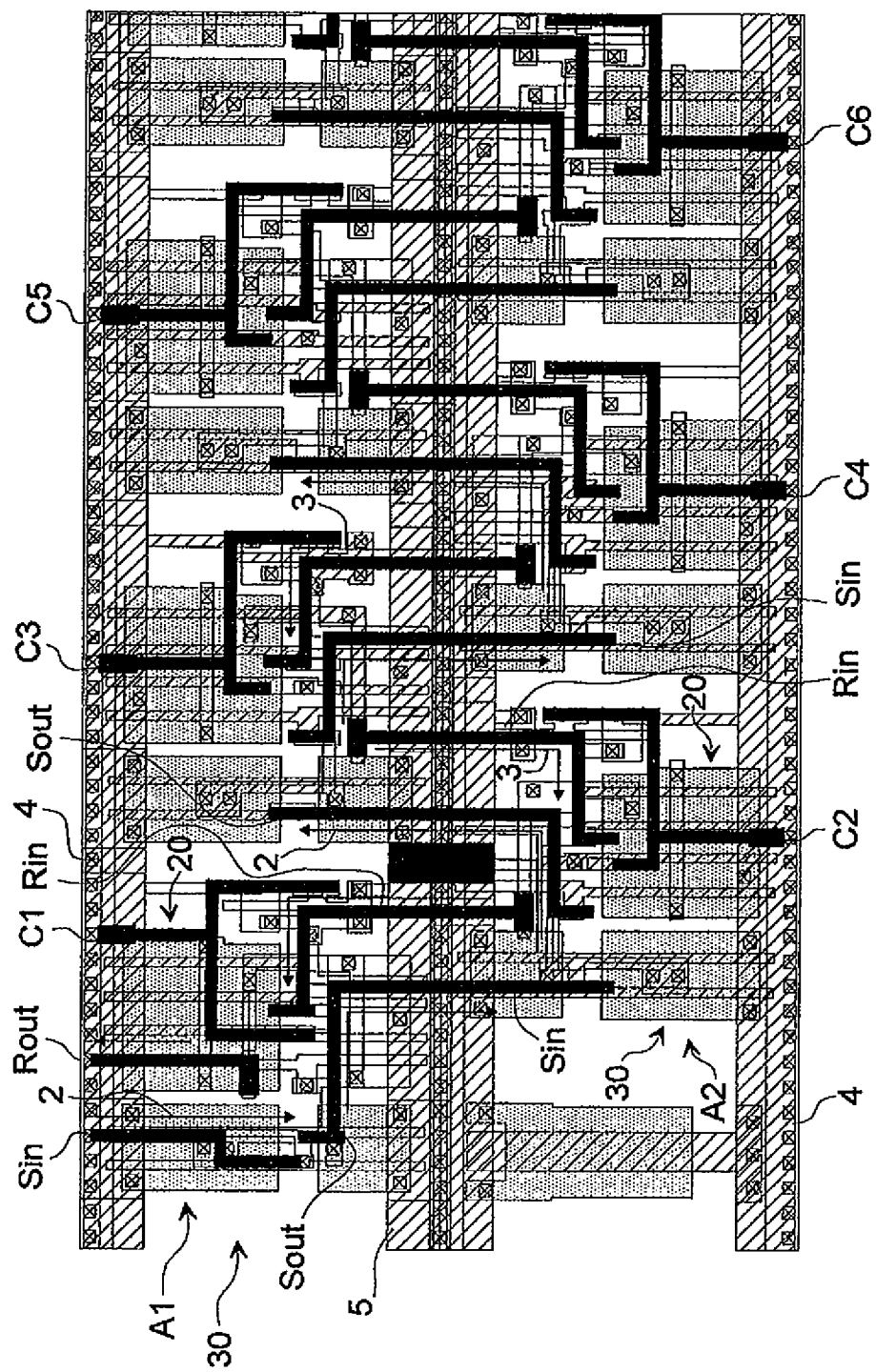
FIG. 7 is a more detailed layout of a part of the device in FIG. 6

Particularly each delay cell of the delay chain integrated in the semiconductor device in FIGS. 6 and 7 implements the delay cell circuit in FIG. 1. Each gate NOT 30 has a first part and a second part, and each inverting multiplexer 20 includes two parts. Both the gate NOT 30 and the inverting multiplexer 30 are manufactured in the semiconductor device in a known way.

The monotonicity of the delay chain is assured by the structure of the delay chain, which includes identical elements, the elements of the same type and with equal paths for the input signal S and the delayed signal R. The length of the delay chain is determined by adding to the delay chain or removing from the delay chain only identical base cells.

The layouts in FIGS. 6 and 7 show in more detail the schematic layout in FIGS. 3 and 4, more precisely the metal lines of the paths 2 and 3 of the signals S and R between the terminals Sin, Sout and Rin, Rout of each cell A1 ... An.

In FIG. 8 is shown a structure of a delay chain with a dedicated layout. Differently from the delay chain in FIG. 4, any cell includes rotated paths for the forward signal and the delayed signal; all the cell of the delay chain are arranged so that for two consecutive cells the paths for the forward signal and the delayed signal are equal. Each cell is partially surrounded by a metal line, which is connected to the supply voltage Vdd or the ground GND.

The various embodiments described above can be combined to provide further embodiments. All of the U.S. patents, U.S. patent application publications, U.S. patent applications, foreign patents, foreign patent applications and nonpatent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
a semiconductor layer having a surface and a delay chain integrated in the semiconductor layer, the delay chain including a plurality of delay cells that include a first delay cell having an input terminal and an output terminal, and a last delay cell having an input terminal and an output terminal, each delay cell having a directional axis and placed in the same semiconductor layer and electrically connected to each other so as to form the delay chain;
first and second metal lines coupled to a supply voltage line;
a third metal line located between the first and second lines and coupled to a reference voltage line, the first, second, and third metal lines placed in a longitudinal direction on the same surface of the semiconductor layer;
the plurality of delay cells having odd numbered delay cells electrically coupled to the first and third metal lines and even numbered delay cells coupled to the second and third metal lines, wherein delay cell of the delay chain is placed with its directional axis in a transversal direction with respect to the respective first and third metal lines; and
a first metal path and a second metal path from the first delay cell to the last delay cell of the delay chain, the first metal path coupled to the input terminal on the first delay cell and to the output terminal on the last delay cell of the delay chain, and the second metal path coupled to the input terminal on the last delay cell and to the output terminal on the first delay cell of the delay chain, the first and second metal paths having portions in each delay cell that are of substantially equal length.

2. The device of claim 1, wherein each portion of the first and second metal paths has between any delay cell and its successive or preceding delay cells of the delay chain, a substantially equal length.

3. The device of claim 1, wherein the first cell of the integrated delay chain comprises an input terminal for the input signal and an output terminal for the delayed input signal.

4. The device of claim 3, wherein each cell of the integrated delay chain is a programmable cell structured to be controlled by a dedicated control signal to switch the input signal from the first metal path to the second metal path so that a delayed input signal of a one cell is at the output terminal of the first cell of the delay chain when the control signal of the one cell of the integrated delay chain assumes a first value.

5. The device of claim 4, wherein each cell of the integrated delay chain is structured to contribute to a predetermined delay to the delayed input signal at the output terminal of the first cell.

6. The device of claim 4, wherein the integrated delay chain includes a succession of delay cells and the delay of the signal at the output terminal of the first cell of the delay chain increases when the delay cell of which the control signal assumes the predetermined value is one of the lasts cells of the succession.

7. The device of claim 1, wherein the directional axis of each delay cell is a longitudinal axis of each delay cell, and the longitudinal axes of the delay cells are parallel to one another, and wherein each delay cell and its successive or preceding delay cells of the delay chain are longitudinally faced toward each other in a staggered arrangement so that any delay cell is faced towards a portion of the preceding delay cell of the delay chain and a portion of the successive delay cell of the delay chain.

8. The device of claim 1, wherein any delay cell comprises a gate NOT having the input and output terminal connected with the first metal path, and an inverting multiplexer having first and second input terminals, said first input terminal and the output terminal connected with the second metal path, and the second input terminal connected with the dedicated control signal.

9. The device of claim 1, wherein any delay cell has a first inverting circuit having the input and output terminal connected with the first metal path and a second inverting circuit having the input and output terminal connected with the second metal path, each delay cell configured to be not inverting.

10. An integrated circuit comprising:
a plurality of delay circuit cells formed in a chain in a semiconductor layer, the semiconductor layer having a surface the chain including a first delay cell having an input terminal and an output terminal and a last delay cell having an input terminal and an output terminal;
first and second metal supply voltage lines and a third metal reference voltage line that is positioned between the first and second metal supply voltage lines, the first, second, and third metal lines formed in a longitudinal direction on the same surface of the semiconductor layer, each delay circuit cell in the semiconductor layer having a longitudinal axis oriented in a direction transverse to the longitudinal direction of the first, second, and third metal lines; and
a first and a second metal path, the first metal path coupled to the input terminal on the first delay cell and coupled to the output terminal on the last delay cell, and the second metal path coupled to the input terminal on the last delay cell and to the output terminal on the first cell of the delay chain, the first and second metal paths having portions in each delay cell of the delay chain that are of substantially equal length.

11. The circuit of claim 10, wherein any delay circuit cell and its successive or preceding delay circuit cells of the chain are longitudinally faced toward each other in a staggered relationship so that any delay circuit cell is faced to a portion of the preceding delay circuit cell of the chain and a portion of the successive delay circuit cell of the chain.

12. The integrated circuit of claim 11, wherein each delay circuit cell includes a first inverting circuit having an input and output terminal connected with the first metal path and a second inverting circuit having an input and output terminal connected with the second metal path, each delay circuit cell configured to be not inverting.

13. The integrated circuit of claim 11, wherein each delay circuit cell of the chain has a control circuit structured to receive a dedicated control signal, the control circuit structured to control a switching of the input signal from the first metal path to the second metal path so that a delayed input signal is at an output terminal of the first delay circuit cell when the control signal of any one delay circuit cell of the chain assumes a first value.

14. The integrated circuit of claim 11, wherein the delay circuit cells are arranged in an interconnected chain in rows with adjacent delay circuit cells in the chain staggered in opposing rows so that each delay circuit cell longitudinally overlaps a preceding delay circuit cell and a succeeding delay circuit cell in the chain.

15. A system, comprising:
a chain of delay cells formed in a semiconductor layer having a surface, the chain of delay cells including a first delay cell having an input terminal and an output terminal and a last delay cell having an input terminal and an output terminal;
first, second, and third longitudinal metal supply lines that are on the surface of the semiconductor layer, each delay cell having a longitudinal orientation that is transverse to the first and second longitudinal metal supply lines, and each delay cell arranged in adjacent rows between the first, second, and third longitudinal metal supply lines and further arranged in a longitudinally staggered relationship with a preceding and a succeeding delay cell in the chain;
the input terminal of the first delay cell in the chain structured to receive an input signal;
the output terminal of the last delay cell in the chain coupled to the input terminal of the first delay cell and structured to output an inverted first delayed signal;
the input terminal of the last delay cell structured to receive the inverted first delayed signal;
the output terminal of the first delay cell coupled to the input terminal of the last delay cell and structured to output a non-inverted further delayed signal; and
a first and a second metal path from the first delay cell to the last delay cell of the delay chain, the first metal path coupled to the input terminal on the first delay cell and to the output terminal on the last cell of the delay chain, and the second metal path coupled to the input terminal on the last delay cell and to the output terminal on the first delay cell, the first and second metal paths having portions in each delay cell of the delay chain that are of substantially equal length.

16. The system of claim 15, wherein the third metal line is coupled to a reference voltage line and the third metal line is structured to be longitudinally oriented between the first and second longitudinal metal supply lines and coupled to each of the delay cells in the chain of delay cells.

17. The system of claim 15, wherein the chain of delay cells includes a first intermediate chain of delay cells and a second intermediate chain of delay cells coupled together wherein the second chain of intermediate delay cells has a first input terminal at a first intermediate delay cell that is coupled to a first output terminal of a last delay cell on the first chain of intermediate delay cells, and a first output terminal on the first delay cell of the second intermediate chain that is coupled to an input terminal on a last delay cell of the first intermediate chain of delay cells.

18. The system of claim 15, wherein each delay cell of the chain of delay cells includes a control circuit structured to receive a control signal and, in response to the control signal, to switch the input signal from the first metal path in the delay cell to the second metal path in the delay cell so that a delayed input signal of a selected cell that receives the control signal is at the output terminal of the first cell of the delay chain when the control signal of the selected cell of the chain assumes a first value.

19. The system of claim 15, wherein each delay cell of the chain of delay cells is structured to contribute to a total delay of the input signal at the output terminal of the first cell.

20. A semiconductor device, comprising:
a semiconductor layer having a surface and a delay chain integrated in the semiconductor layer, the delay chain having a plurality of delay cells that includes a first delay cell having an input terminal structured to receive an input signal and an output terminal structured to convey a delayed input signal, the plurality of delay cells further including a last delay cell, each delay cell having a directional axis and located in the same semiconductor layer and electrically connected to each other so as to form the delay chain;
first and second metal lines coupled to a supply voltage line;
a third metal line located between the first and second lines and coupled to a reference voltage line, the first, second, and third metal lines placed in a longitudinal direction on the same surface of the semiconductor layer;
each odd numbered delay cell of the plurality of delay cells electrically coupled to the first and third metal lines and each even numbered delay cell coupled to the second and third metal lines, wherein each delay cell of the delay chain is placed with its directional axis in a transversal direction with respect to the first and third metal lines;
a first metal path and a second metal path from the first delay cell to the last delay cell of the delay chain;
the input terminal on the first delay cell coupled to the first metal path and the output terminal on the first delay cell coupled to the second metal path;
an input terminal on the last delay cell coupled to the second metal path and an output terminal on the last cell of the delay chain coupled to the first metal path;
each portion of the first and second metal paths of each delay cell having substantially equal length for each delay cell; and
wherein each delay cell of the integrated delay chain is a programmable cell structured to be controlled by a dedicated control signal to switch the input signal from the first metal path to the second metal path so that a delayed input signal of a one delay cell is at the output terminal of the first delay cell of the delay chain when the control signal of the one delay cell of the delay chain assumes a first value.

21. The device of claim 20, wherein each delay cell of the delay chain is structured to contribute to a predetermined delay to the delayed input signal at the output terminal of the first cell.

22. The device of claim 20, wherein the delay chain includes a succession of delay cells, and the delay of the signal at the output terminal of the first cell of the delay chain increases when a delay cell at which the control signal assumes the first value is one of the last cells of the succession.

23. The device of claim 20, wherein the directional axis of each delay cell is a longitudinal axis of each delay cell, and the longitudinal axes of the delay cells are parallel to one another, and wherein each delay cell and its successive or preceding delay cells of the delay chain are longitudinally faced toward each other in a staggered arrangement so that any delay cell is faced towards a portion of the preceding delay cell of the delay chain and a portion of the successive delay cell of the delay chain.

24. An integrated circuit comprising:

a plurality of delay circuit cells formed in a chain in a semiconductor layer, the semiconductor layer having a surface, the chain of delay circuit cells including a first delay circuit having an input terminal structured to receive an input signal and an output terminal structured to output a delayed input signal;

first and second metal lines coupled to a supply voltage source and a third metal line coupled to a reference voltage source, the third metal line positioned between the first and second metal lines, the first, second, and third metal lines formed in a longitudinal direction on the same surface of the semiconductor layer, each delay circuit cell in the semiconductor layer having a longitudinal axis oriented in a direction transverse to the longitudinal direction of the first, second, and third metal lines, and any delay circuit cell and its successive or preceding delay circuit cells of the chain of delay circuit cells are longitudinally faced toward each other in a staggered relationship so that any delay circuit cell is faced to a portion of the preceding delay circuit cell of the chain and a portion of the successive delay circuit cell of the chain;

a first metal path having an input terminal coupled to a first delay circuit cell in the chain of delay circuit cells, and an output terminal coupled to the last delay circuit cell in the chain;

a second metal path having an input terminal coupled to the last delay circuit cell in the chain and an output terminal coupled to the first delay circuit cell in the chain; and each delay circuit cell of the chain has a control circuit structured to receive a dedicated control signal, the control circuit structured to control a switching of the input signal from the first metal path to the second metal path so that a delayed input signal is at the output terminal of the first delay circuit cell when the control signal of any one delay circuit cell of the chain assumes a first value.

25. The integrated circuit of claim 24, wherein each delay circuit cell includes a first inverting circuit having an input terminal and output terminal connected with the first metal path and a second inverting circuit having an input terminal and output terminal connected with the second metal path, each delay circuit cell configured to be not inverting.

26. The integrated circuit of claim 24, wherein the delay circuit cells are arranged in rows with adjacent delay circuit cells in the chain staggered in opposing rows so that each delay circuit cell longitudinally overlaps a preceding delay circuit cell and a succeeding delay circuit cell in the chain.

27. A system, comprising:

a chain of delay cells formed in a semiconductor layer having a surface;

first, second, and third longitudinal metal supply lines that are on the surface of the semiconductor layer, each delay cell having first and second metal paths and a longitudinal orientation that is transverse to the first and second longitudinal metal supply lines, and each delay cell arranged in adjacent rows between the first, second, and third longitudinal metal supply lines and further arranged in a longitudinally staggered relationship with a preceding and a succeeding delay cell in the chain;

a first input terminal at a first delay cell in the chain structured to receive an input signal;

a first output terminal at a last delay cell in the chain, the first output terminal coupled to the first input terminal and structured to output an inverted first delayed signal;

a second input terminal at the last delay cell, the second input terminal structured to receive the inverted first delayed signal;

a second output terminal on the first delay cell, the second output terminal coupled to the second input terminal and structured to output a non-inverted further delayed signal; and each delay cell of the chain of delay cells includes a control circuit structured to receive a control signal and, in response to the control signal, to switch the input signal from a first metal path in the delay cell to a second metal path in the delay cell so that a delayed input signal of a delay cell that receives the control signal is at an output terminal of the first cell of the delay chain when the control signal assumes a first value.

28. The system of claim 27, wherein the third metal line is coupled to a reference voltage line and the third metal line is structured to be longitudinally oriented between the first and second longitudinal metal supply lines and coupled to each of the delay cells in the chain of delay cells.

29. The system of claim 27, wherein the chain of delay cells includes a first intermediate chain of delay cells and a second intermediate chain of delay cells coupled together, the second chain of intermediate delay cells having a first input terminal at a first intermediate delay cell that is coupled to a first output terminal of a last delay cell on the first chain of intermediate delay cells, and a first output terminal on the first delay cell of the second intermediate chain that is coupled to an input terminal on a last delay cell of the first intermediate chain of delay cells.

30. The system of claim 27, wherein each delay cell of the chain of delay cells is structured to contribute to a total delay of the input signal at the output terminal of the first cell.

* * * * *